(12) United States Patent
Furukawa et al.

(10) Patent No.: US 6,531,724 B1
(45) Date of Patent: Mar. 11, 2003

(54) BORDERLESS GATE STRUCTURES

(75) Inventors: Toshiharu Furukawa, Essex Junction, VT (US); Mark C. Hakey, Milton, VT (US); Steven J. Holmes, Milton, VT (US); David V. Horak, Essex Junction, VT (US); Paul A. Rabidoux, Winooski, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/686,740

(22) Filed: Oct. 10, 2000

Related U.S. Application Data

(62) Division of application No. 09/224,759, filed on Jan. 4, 1999, now Pat. No. 6,207,514.

(51) Int. Cl.$^7$ .............................................. H01L 29/772
(52) U.S. Cl. ...................................... 257/288; 257/384
(58) Field of Search ................................. 257/288, 384

(56) References Cited

U.S. PATENT DOCUMENTS

| | | | |
|---|---|---|---|
| 4,592,933 A | | 6/1986 | Meyerson et al. |
| 4,672,169 A | | 6/1987 | Chambers |
| 5,330,936 A | | 7/1994 | Ishitani |
| 5,348,900 A | | 9/1994 | Ayukawa et al. |
| 5,358,879 A | | 10/1994 | Brady et al. |
| 5,364,804 A | | 11/1994 | Ho et al. |
| 5,376,578 A | | 12/1994 | Hsu et al. |
| 5,397,722 A | | 3/1995 | Bashir et al. |
| 5,545,581 A | | 8/1996 | Armacost et al. |
| 5,620,912 A | | 4/1997 | Hwang et al. |
| 5,668,065 A | | 9/1997 | Lin |
| 5,899,742 A | | 5/1999 | Sun |
| 6,072,222 A | * | 6/2000 | Nistler |
| 6,274,488 B1 | * | 8/2001 | Talwar et al. |
| 6,277,683 B1 | * | 8/2001 | Pradeep et al. |
| 6,365,472 B1 | * | 4/2002 | Ishimaru et al. ............ 438/301 |

OTHER PUBLICATIONS

Jasinski et al. 27341 "Photochemical Deposition of Graded Silicon Nitride", Research Disclosure, Jan. 1987, No. 273.
Jasinski et al. 27343 "Photochemical Deposition of Silicon Nitride", Research Disclosure, Jan. 1987, No. 273.
Mihailescu et al. "Direct nitridation of a silicon surface by multipulse excimer laser irradiation in a nitrogen–containing ambient gas", Journal of Applied Physics 70, Aug. 15, 1991, pp 2123–2131.
Mihailescu et al. "Synthesis and deposition of silicon nitride films by laser reactive ablation of silicon in low pressure ammonia: A parametric study", Journal of Vacuum Science Technology 14, Jul./Aug. 1996, pp 1986–1994.
Stanasolovich, et al. "Method for Reducing the Diffusion Contact Borders", IBM Technical Disclosure Bulletin, vol. 32, No. 4A, Sep. 1989, pp. 344–345.

(List continued on next page.)

*Primary Examiner*—George Fourson
(74) *Attorney, Agent, or Firm*—Schmeiser, Olsen & Watts; William D. Sabo

(57) ABSTRACT

A method for forming a gate conductor cap in a transistor comprises the steps of: a) forming a polysilicon gate conductor; b) doping the polysilicon gate; c) doping diffusion areas; and d) capping the gate conductor by a nitridation method chosen from among selective nitride deposition and selective surface nitridation. The resulting transistor may comprise a capped gate conductor and borderless diffusion contacts, wherein the capping occurred by a nitridation method chosen from among selective nitride deposition and selective surface nitridation and wherein a portion of the gate conductor is masked during the nitridation method to leave open a contact area for a local interconnect or a gate contact.

8 Claims, 9 Drawing Sheets

OTHER PUBLICATIONS

Weiner et al. "Self Aligned Silicide Formation Using Gas Immersion Laser Annealing (GILA)", Ultratech Stepper technical brief, Mar. 3, 1997.

Weiner et al. "Ultrashallow Junction Formation Using Projection Gas Immersion laser Doping (PGILD)", Verdant Technologies technical brief, Aug. 20, 1997.

Derwent World Patent Index "Japanese Patent 8148680 Abstract", Jun. 7, 1996.

* cited by examiner

BORDERLESS GATE STRUCTURES

RELATED APPLICATION

This application is a division of application by Furukawa et al. entitled "METHOD FOR FORMING BORDERLESS GATE STRUCTURES AND APPARATUS FORMED THEREBY", Ser. No. 09/224,759, filed Jan. 4, 1999, now U.S. Pat. No. 6,207,513.

BACKGROUND OF THE INVENTION

1. Technical Field

This invention relates to the field of transistor gate conductor structures in semiconductor devices. More specifically, the invention relates to a method for forming borderless gate structures and the apparatus formed thereby.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in complimentary metal-oxide semiconductor (CMOS) technologies, such as in the design and fabrication of field effect transistors (FETs). FETs are used in almost all types of integrated circuit design (i.e., microprocessors, memory, etc.) One feature that increases device density is a "borderless contact." To explain the significance of a borderless contact, one example of a defective wafer portion 400 is shown in FIG. 3 having a partially formed FET on semiconductor substrate 480 between isolation areas 490. When a contact hole 410 for a diffusion contact to a diffusion area 420 is opened through a passivation oxide layer 430, it may expose a portion of a gate conductor 440 to contact hole 410. Even though sidewall spacers 450 protect the side of gate conductor 440 from shorting, if a diffusion contact were formed in contact hole 410, then it may easily short to the top of gate conductor 440. Accordingly, a contact border, as shown on wafer portion 460 in FIG. 4, is often used to prevent shorting between gate conductor 440 and diffusion contact 470. In wafer portion 460, the contact hole in which diffusion contact 470 is formed is shifted away from gate conductor 440 to create a border of passivation oxide 430 between gate conductor 440 and diffusion contact 470. The contact border thus reduces the potential for diffusion contact 470 to short to gate conductor 440. Unfortunately, the use of such a contact border expands the area needed for FETs, consuming a great deal of chip area and preventing further increases in circuit density.

As described in IBM Technical Disclosure Bulletin, Vol. 32, No. 4A, September 1989 (MA888-0005), current technology provides for the fabrication of a silicon gate conductor such that diffusion contacts may be formed without borders, that is, borderless contacts may be used. Referring to FIG. 5, a wafer portion 500 is shown having a semiconductor substrate 580 with isolation areas 590, a gate oxide layer 530, a silicon gate conductor material layer 540, and an etch-stop dielectric film layer 560 formed thereon. Etch-stop dielectric 560 is not used in a typical silicon gate process for forming transistor gate conductor structures. However, use of etch-stop dielectric 560 provides the opportunity to increase device density by forming borderless contacts to diffusion areas. Unfortunately, the method of protecting gate conductors with etch-stop dielectric 560 possesses several limitations. For example, after formation of gate structures, gate polysilicon is typically doped by implantation to decrease sheet resistance at the same time the source and drain diffusion areas are implanted. In some circumstances, the presence of etch-stop dielectric 560 on top of a gate structure is sufficient to preclude such a single implantation step. Accordingly, gate conductor material layer 540 in FIG. 5 must be implanted before depositing etch-stop dielectric film layer 560 and a separate implantation step for diffusion areas will occur after formation of gate structures. More importantly, selective metal silicide, such as $CoSi_x$ or $TiSi_x$, is typically formed in the surface of source and drain diffusion areas and gate conductors in a single step after the implantation step. If etch-stop dielectric 560 is used, then selective metal silicide must be formed on gate conductor material layer 540 after it is implanted, but before depositing etch-stop dielectric film layer 560. A separate step of forming selective metal silicide in diffusion areas will occur after implanting the diffusion areas.

To form a wafer portion 600 as shown in FIG. 6 from wafer portion 500 in FIG. 5, gate conductors and interconnects are defined in the stack of gate oxide layer 530, gate conductor material 540, and etch-stop dielectric 560, leaving the top of each gate conductor covered with etch-stop dielectric film layer 560. Next, sidewall spacers 650 are formed on the sides of gate conductor 540, encapsulating gate conductor 540 in dielectric, and diffusion areas 620 are implanted. Passivation oxide 630 is formed over the structures and contact holes formed therein for diffusion contacts (not shown). Notably, gate conductor 540 is covered on the top with etch-stop dielectric 560, thus, the encapsulating material will remain after the contact hole etch. FIG. 6 shows diffusion contacts 670 formed in contact holes, wherein no contact border is needed to prevent shorting between diffusion contacts 670 and gate conductor 540. Instead, etch-stop dielectric 560 is in place to prevent shorting and device density is increased since the contact holes were shifted closer to gate conductor 540.

Therefore, there existed a need to provide a method of fabricating borderless contacts that is compatible with current silicon gate fabrication processes.

DISCLOSURE OF INVENTION

According to the present invention, a method is provided for forming a gate conductor cap in a transistor comprising the steps of: a) forming a polysilicon portion of a gate conductor on a substrate having a semiconductor portion; b) doping the polysilicon portion; c) doping a plurality of diffusion areas in the semiconductor portion; and d) capping the gate conductor by a nitridation method chosen from among selective nitride deposition and selective surface nitridation.

Also according to the present invention, a transistor is provided comprising a capped gate conductor and borderless diffusion contacts, wherein the capping occurred by a nitridation method chosen from among selective nitride deposition and selective surface nitridation and wherein a portion of the gate conductor is masked during the nitridation method to leave open a contact area for a local interconnect.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and.

BEST MODE FOR CARRYING OUT THE INVENTION

According to a preferred embodiment of the present invention, a method is provided for forming a gate conductor cap in a transistor comprising the steps of: a) forming a polysilicon portion of a gate conductor on a substrate having a semiconductor portion; b) doping the polysilicon portion; c) doping a plurality of diffusion areas in the semiconductor portion; and d) capping the gate conductor by a nitridation method chosen from among selective nitride deposition and selective surface nitridation. Also, a transistor is provided comprising a capped gate conductor and borderless diffusion contacts, wherein the capping occurred by a nitridation method chosen from among selective nitride deposition and selective surface nitridation and wherein a portion of the gate conductor is masked during the nitridation method to leave open a contact area for a local interconnect.

Figure 1:
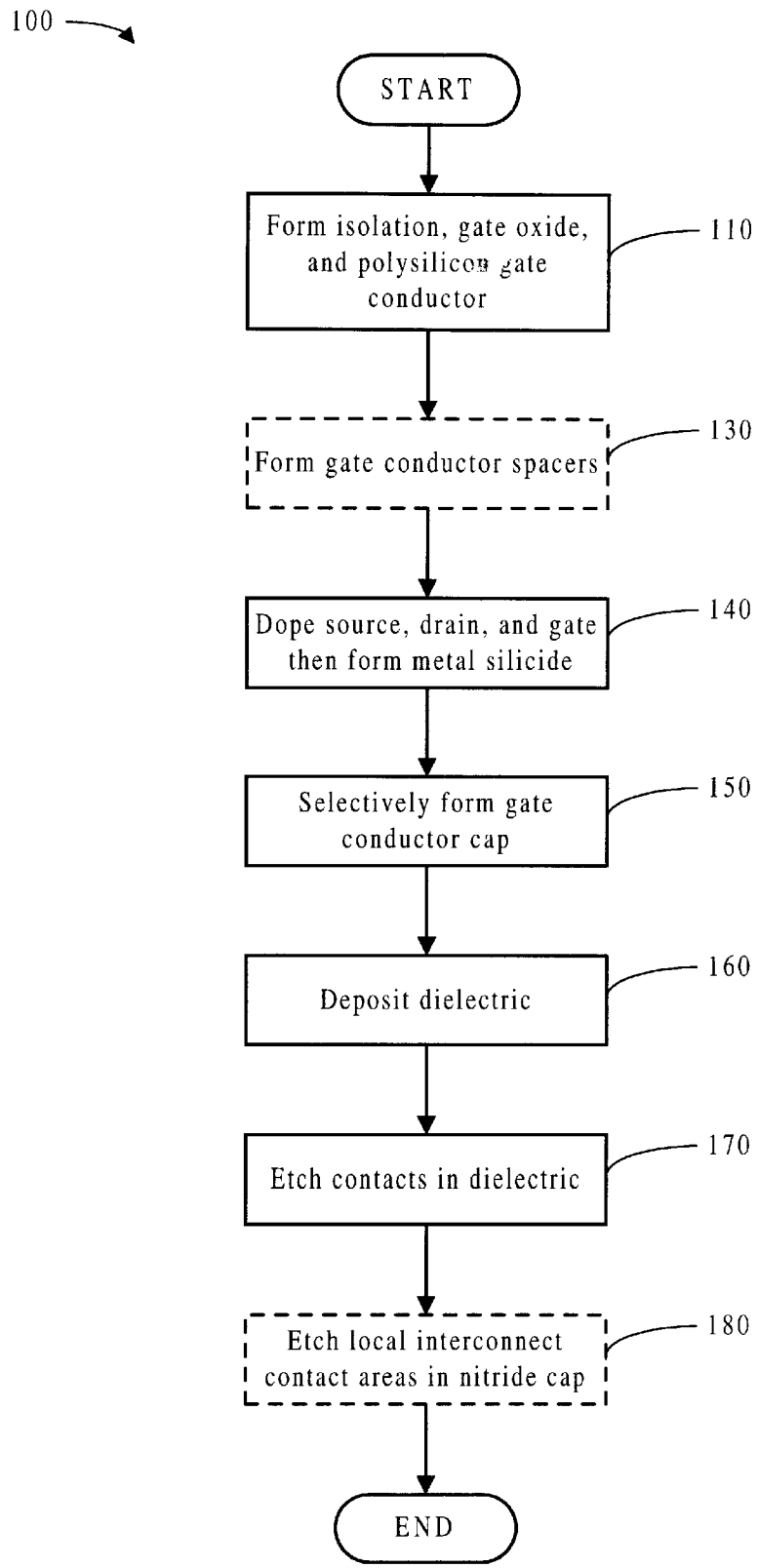
FIG. 1 is a flow diagram showing a method for forming borderless gate structures according to a preferred embodiment of the present invention.
Figure 2:
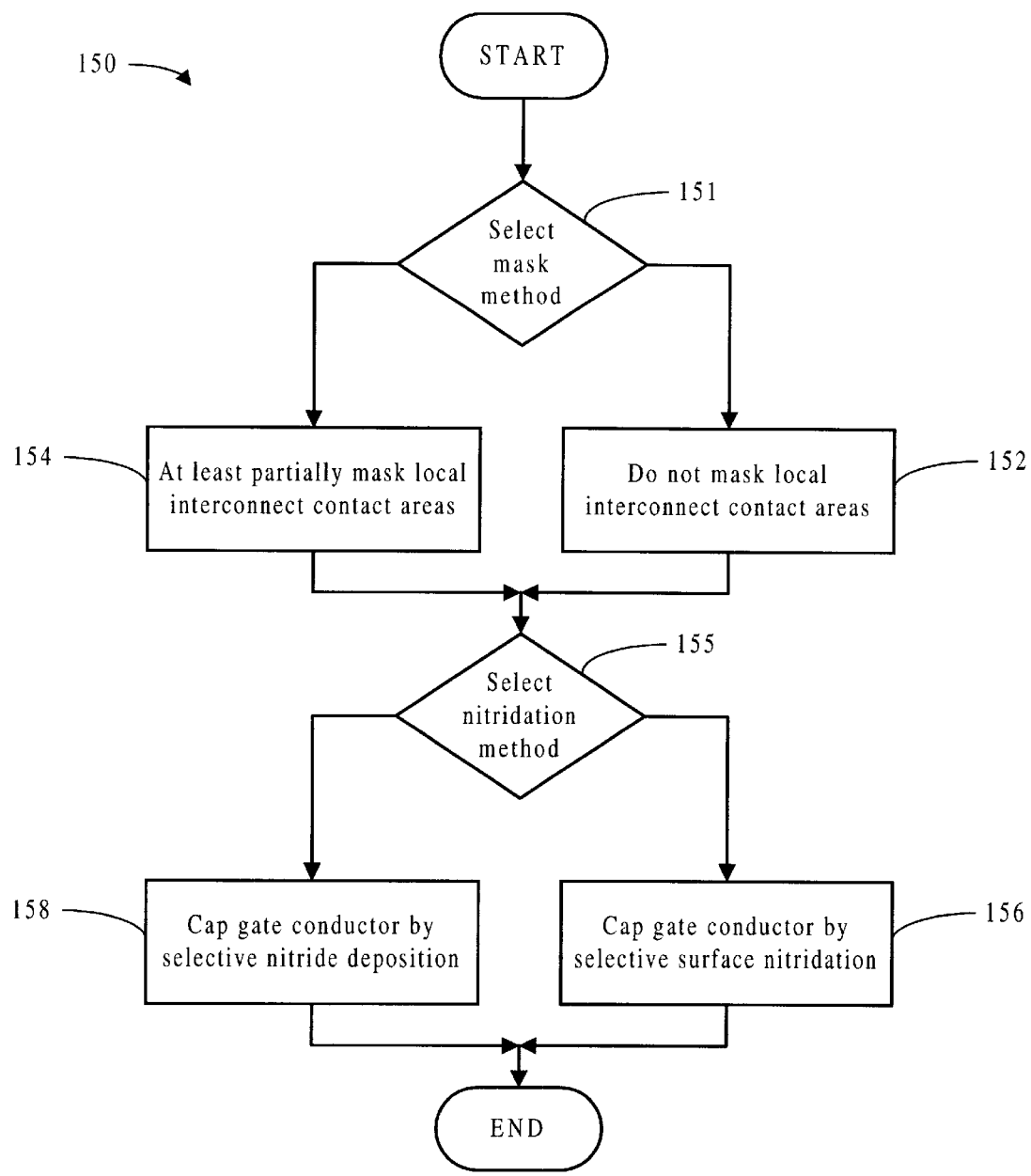
FIG. 2 is a detailed flow diagram for step 150 in FIG. 1.
Figure 3:
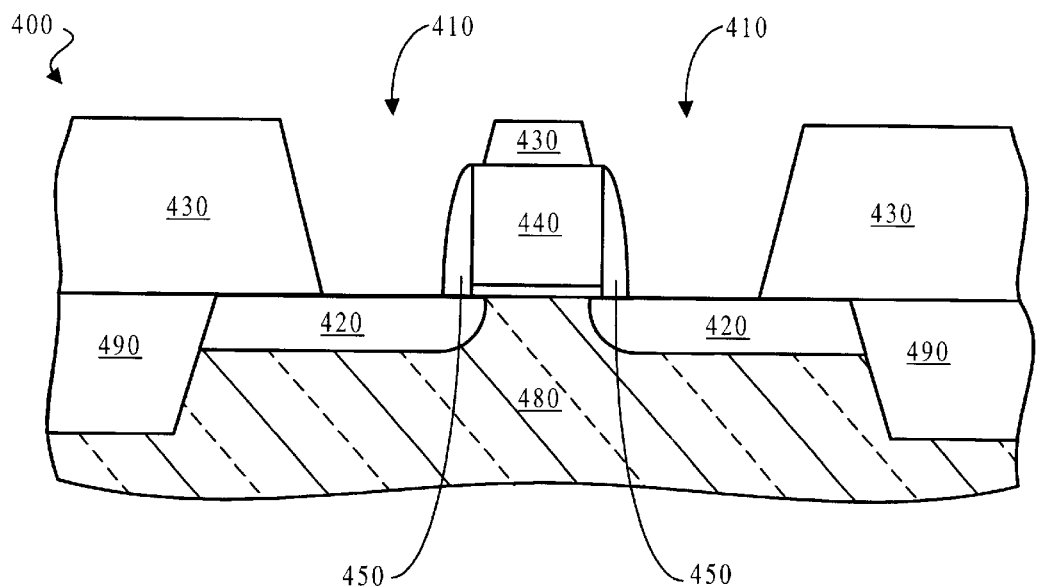
FIG. 3 is a cross-sectional view of a wafer portion showing a shorted gate.
Figure 4:
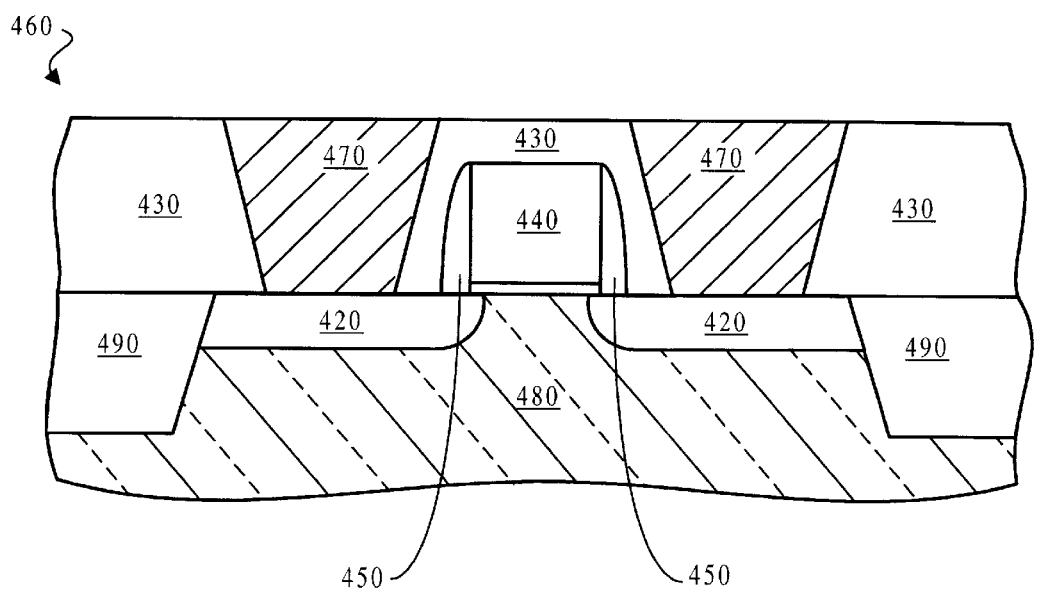
FIG. 4 is a cross-sectional view of a wafer portion showing a bordered contact.
Figure 5:
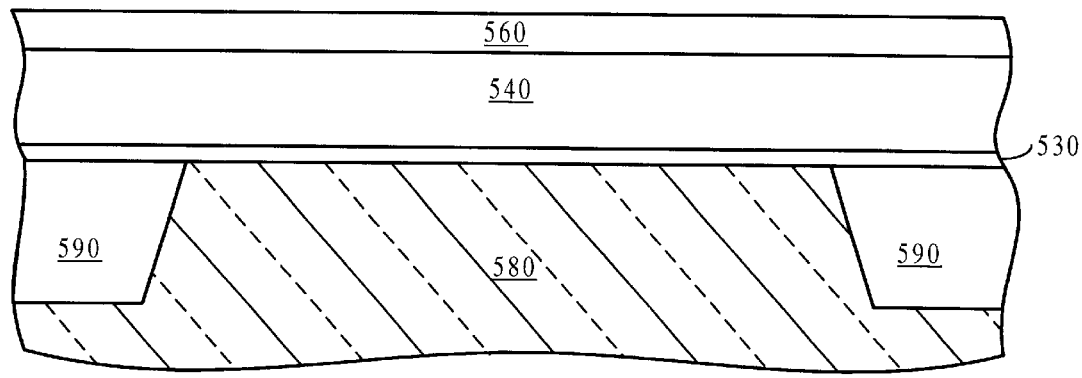
FIG. 5 is a cross-sectional view of a wafer portion intermediate in a method for forming borderless contacts according to conventional methods.
Figure 7:
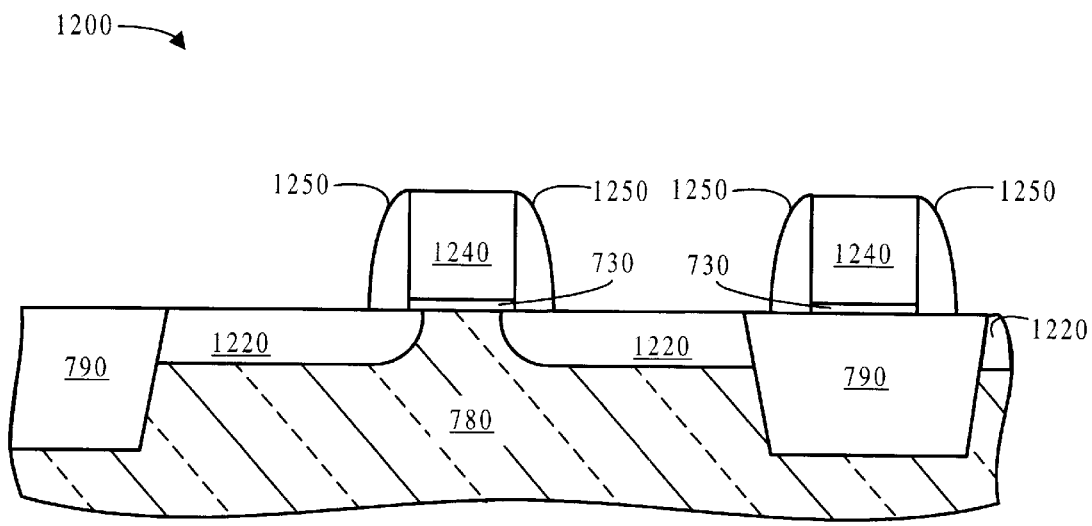
FIGS. 7–15 are cross-sectional views of wafer portions intermediate in the method in FIGS. 1 and 2.

Referring to FIGS. 1 and 2, a preferred method 100 for forming transistor gate structures is shown. In step 110 of method 100, fabrication of a wafer portion 1200, as shown in FIG. 7, is begun by forming isolation structures 790 in a semiconductor substrate 780 followed by formation of a layer of gate oxide on semiconductor substrate 780 and formation of a layer of polysilicon for a gate conductor on the layer of gate oxide. The layers are then patterned, removing unneeded portions and leaving gate oxide portion 730 and polysilicon portion 1240. After step 110, method 100 in FIG. 1 shows optional step 130 of forming gate conductor spacers. Step 130 is considered optional in the event that spacers are not desired. Spacers may be formed in association with trimming of polysilicon portion 1240 as disclosed in the copending patent application by Furukawa et al. entitled "METHOD FOR SELECTIVELY TRIMMING GATE STRUCTURES AND APPARATUS FORMED THEREBY", Ser. No. 09/224,757, filed Jan. 4, 1999, which is incorporated herein by reference. Trimming is used to scale down the dimensions of polysilicon portion 1240 so that the resulting gate conductor will be smaller and the associated field effect transistors (FETs) will be faster and operate at lower power. Also, depending on the dimension of any spacers formed during trimming, it may be desirable to form additional spacer material over such spacers. Accordingly, if a spacer of a certain desired dimension is not produced during trimming, the dimension may be increased in step 130 to complete formation of gate conductor spacers.

Step 140 of doping the source, drain, and gate then forming metal silicide is also exemplified by wafer portion 1200 in FIG. 7, wherein "doping" includes ion implantation, chemical doping by heating wafer portion 1200 in the presence of a dopant, and other methods known to those skilled in the art for forming diffusion areas and doping polysilicon gate conductors. Wafer portion 1200 may include any of the structures formed in keeping with the preferred embodiment of the present invention as described for steps 110 to 130 above. Accordingly, wafer portion 1200 preferably includes gate conductor 1240, which may be trimmed or untrimmed, gate conductor spacers 1250, which may be formed during trimming, during step 130, or both, and diffusion areas 1220. For wafer portion 1200, it is an advantage that a single doping step may be used to form diffusion areas 1220 and dope gate conductor 1240. If gate conductor 1240 were capped as in FIG. 6, then it would be necessary to dope gate conductor 1240 prior to such capping and step 140 would only include doping diffusion areas 1220.

Forming metal silicide in step 140 includes methods known to those skilled in the art for forming $TiSi_x$, $CoSi_x$, or other metal silicides in the surface of diffusion areas 1220 and gate conductor 1240 to decrease sheet resistance. While it is preferred that step 140 include some effort to decrease sheet resistance, it is conceivable that such effort may not be necessary in all cases. Accordingly, forming metal silicide is considered optional in step 140 of the present invention. For wafer portion 1200, it is also an advantage that a single step may be used to form metal silicide in diffusion areas 1220 as well as in gate conductor 1240. If gate conductor 1240 were capped as in FIG. 6, then it would be necessary to form metal silicide after doping gate conductor 1240, but prior to such capping, and step 140 would only include forming metal silicide in diffusion areas 1220.

In step 150 of method 100, a cap is selectively formed on gate conductor 1240, or another gate conductor formed according to the present invention, such that borderless contacts to diffusion areas 1220 may be used. FIG. 2 shows step 150 in more detail, wherein step 151 includes selecting either step 152 of not masking local interconnect contact areas on gate conductor 1240 or step 154 of at least partially masking local interconnect contact areas. Step 155 includes selecting either step 156 of capping gate conductor 1240 by selective surface nitridation or step 158 of capping by selective nitride deposition.

Step 156 essentially involves a novel, specialized technique for growing a silicon nitride dielectric film on selected silicon-rich surfaces, such as polysilicon portion 1240. By means of laser mediated film growth, this step may selectively grow film as well as trim the exposed surface area of the gate conductor. Polysilicon portion 1240 is irradiated, preferably at 308 nanometers (nm) wavelength, with a high-power laser irradiation system to heat the surface in the presence of ammonia, causing formation and growth of a silicon nitride oxide film. The properties of the polysilicon are such that it will absorb the laser irradiation and heat sufficiently to grow the dielectric film. The areas surrounding polysilicon portion 1240 are not comprised of polysilicon, accordingly, it is unlikely that the surrounding areas will heat sufficiently to grow the dielectric film.

For example, semiconductor substrate 780 is preferably single-crystal silicon, which has a higher thermal conductivity than polysilicon and readily dissipates heat from its exposed surface into the substrate. Preferably, polysilicon portion 1240 is selectively irradiated by use of a masking feature with the laser irradiation system. If the irradiation is masked to only expose polysilicon portion 1240, then it is even less likely that the dielectric film will grow anywhere other than on polysilicon portion 1240. To grow the film, the silicon at the surface of polysilicon portion 1240 is converted to silicon nitride, simultaneously scaling down the size of polysilicon portion 1240. Essentially, the source for the silicon in the silicon nitride film is the silicon atoms near the surface of polysilicon portion 1240. Thus, as the silicon atoms near the surface are reacted to silicon nitride, the size of polysilicon portion 1240 decreases.

Figure 6:
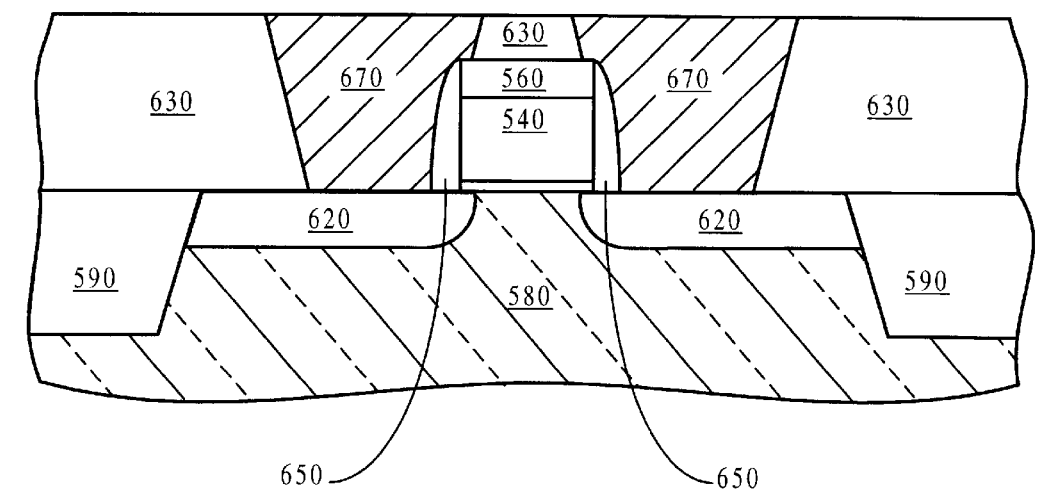
FIG. 6 is a cross-sectional view of a wafer portion that results from a method for forming borderless contacts according to conventional methods.
Figure 8:
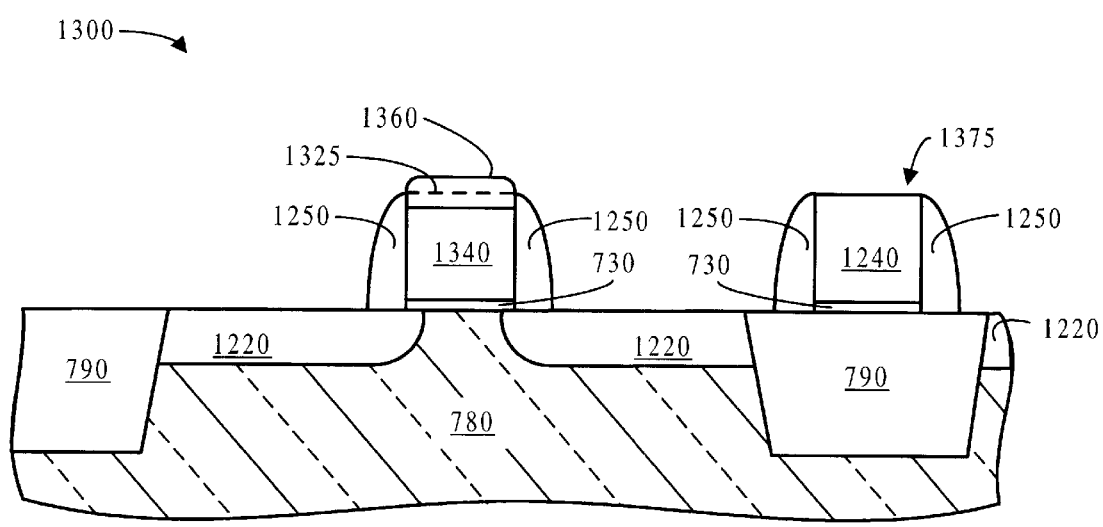
Figure 14:
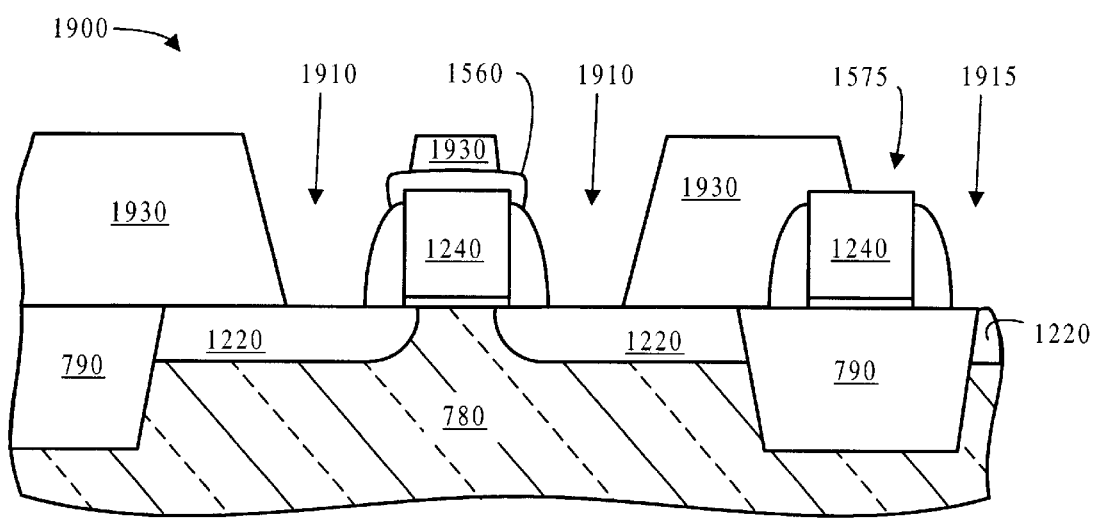

FIG. 8 shows wafer portion 1300 wherein gate conductor 1240 from FIG. 14 has been capped by selective surface nitridation (step 156) after masking local interconnect contact area 1375 (step 154). Masking other areas is a preferred option, but is not required for the invention to operate since it is likely that only the polysilicon will heat sufficiently to grow a dielectric film. Wafer portion 1300 includes gate conductor 1340 with a dielectric film 1360 grown thereon according to a preferred embodiment of the present invention. Dashed line 1325 indicates the dimension of gate conductor 1240 prior to growth of dielectric film 1360 and shows that the dimension of gate conductor 1340 is reduced compared to its prior dimension shown in FIG. 7. Also, FIG. 6 shows that dielectric film 1360 essentially forms a cap to isolate gate conductor 1340.

As described earlier, the growth of dielectric film by selective surface nitridation involves absorbing of laser irradiation and reacting silicon atoms near the surface to form silicon nitride. Accordingly, if the material does not sufficiently heat upon absorbing laser irradiation, then no dielectric film will grow. Also, if a particular surface is more rich in silicon than another surface, then the silicon-rich surface will tend to promote faster dielectric film growth compared to the other surface. It is even conceivable that no dielectric film will grow on a surface that is sufficiently silicon-poor. Preferably, gate conductor 1240 is doped polysilicon and gate conductor spacers 1250 are common silicon oxide or silicon nitride. Thus, gate conductor 1240 is preferably silicon-rich and will grow dielectric film 1360 faster than gate conductor spacers 1250. Nevertheless, other material known to those skilled in the art may be used for gate conductor spacers 1250 that are silicon-rich and will heat sufficiently upon absorbing laser irradiation. Such materials include silicon-rich silicon oxynitride and silicon-rich silicon nitride. The result is that dielectric film 1360 may be equally thick in the region capping gate conductor 1340 as it is in the region capping gate conductor spacers 1250. Accordingly, the scope of the invention includes various thickness scenarios for dielectric film 1360 and the related methods of formation.

Figure 9:
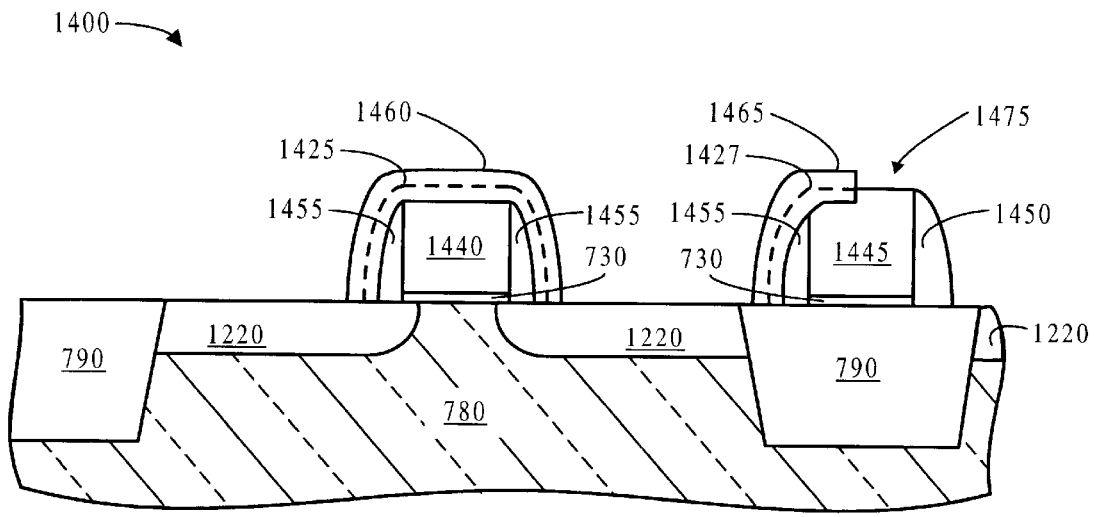

FIG. 9 shows wafer portion 1400 wherein one gate conductor 1240 from FIG. 7 has only been partially capped by selective surface nitridation (step 156) after masking local interconnect contact area 1475 (step 154). Also, the gate conductor spacers are formed of silicon-rich silicon oxynitride so a nitride film is grown thereon as well. Essentially, the masking feature of the masked, laser irradiation system can be used selectively to grow a nitride film on only a part of gate conductor 1240 and gate conductor spacers 1455. Thus, by masking local interconnect contact area 1475 and gate conductor spacer 1450 from the laser irradiation, wafer portion 1400 includes partially capped gate conductor 1445 and gate conductor spacer 1455 with a dielectric film 1465 grown partially thereon. Dashed line 1427 indicates the dimension of gate conductor 1240 and gate conductor spacer 1250 prior to growth of dielectric film 1465. Wafer portion 1400 also includes capped gate conductor 1440 and gate conductor spacers 1455 with a dielectric film 1460 grown thereon. Dashed line 1425 indicates their dimensions prior to growth of dielectric film 1460.

According to step 158 in FIG. 2, gate conductor 1240 and spacers 1250 in FIG. 7 may also be capped by selective nitride deposition. Step 158 essentially involves a novel, specialized technique for depositing a silicon nitride dielectric film on selected surfaces, such as gate conductor 1240, rather than growing such a film. By means of laser mediated film deposition, these steps may selectively cap the exposed surface area of the gate conductor. Gate conductor 1240 and spacers 1250 are irradiated, preferably at 308 nm, with a high-power laser irradiation system to heat the surface in the presence of ammonia and silane, causing deposition of a silicon nitride film only in areas heated by irradiation. As discussed above, only some materials will absorb enough laser energy to heat sufficiently, so masking is not necessary. Masking is preferred, however, to ensure that proper film deposition occurs. Some of the materials that will not absorb sufficient laser energy for selective nitride deposition might be used to form spacers 1250. For example, silicon dioxide will not absorb 308 nm laser exposure. Accordingly, in some circumstances, only gate conductor 1240 and not spacers 1250 will be capped in step 158. Nevertheless, spacers 1250 may be capped if formed, for example, from silicon-rich silicon nitride, silicon-rich silicon oxynitride, or similarly absorptive materials known to those skilled in the art. Such spacers may be formed by the methods according to the preferred embodiments of the present invention or by other methods that may be presently known. To deposit the film in step 158, the desired deposition area is generally irradiated with less energy than would be needed to grow a dielectric film in step 156. Specific conditions are explained below. Also, because silane is provided as a silicon source, the silicon near the surface of gate conductor 1240 will not necessarily react in the deposition to reduce the dimension of gate conductor 1240 as it may in step 156.

Figure 10:
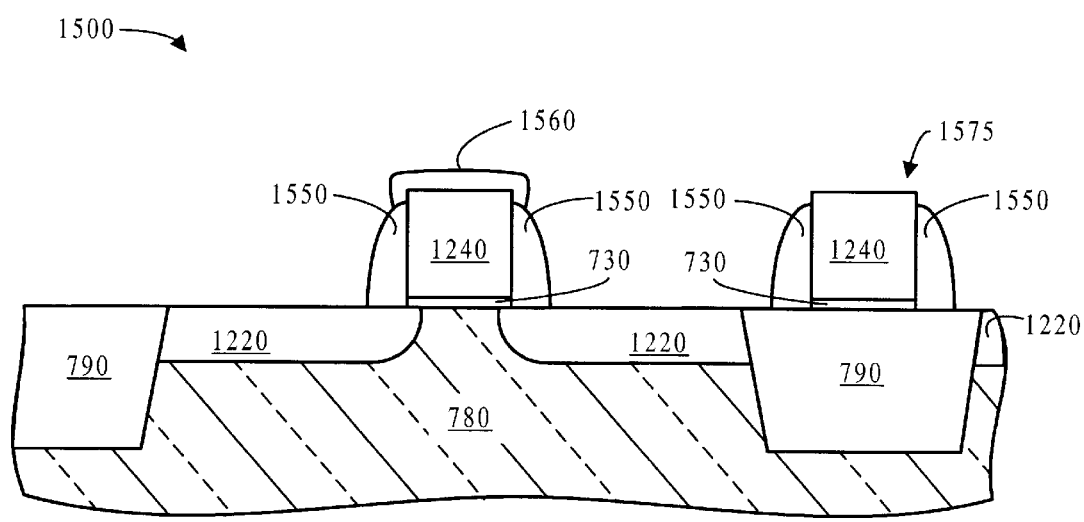

FIG. 10 shows wafer portion 1500 wherein gate conductor 1240 from FIG. 7 has been capped by selective nitride deposition (step 158) after masking local interconnect contact area 1575 (step 154). Wafer portion 1500 includes gate conductor 1240 with a dielectric film 1560 deposited thereon according to a preferred embodiment of the present invention. FIG. 10 shows that dielectric film 1560 essentially forms a cap surrounding the exposed portion of gate conductor 1240. Notably, etched back spacers 1550 in FIG. 10 not extend high enough to be even with the top of gate conductor 1240. This is different from spacers 1250 in FIG. 7 which are even with the top of gate conductor 1240. It is preferred that etched back spacers 1550 are used when a gate conductor is to be capped by selective nitride deposition. Etched back spacers 1550 allow nitride to form around the corners of gate conductor 1240 for better encapsulation.

Figure 11:
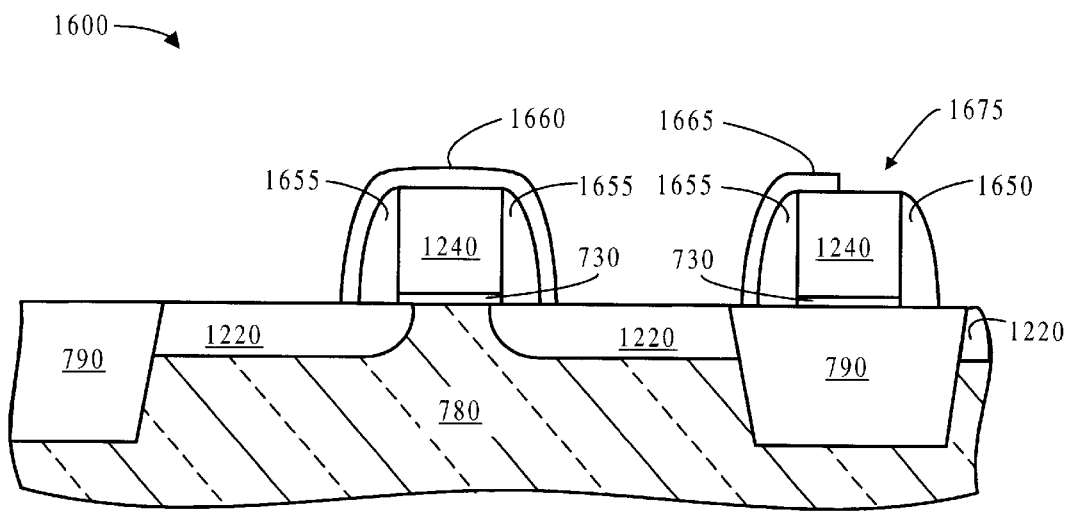

FIG. 11 shows wafer portion 1600 wherein one gate conductor 1240 from FIG. 7 has only been partially capped by selective nitride deposition (step 158) after masking local interconnect contact area 1675 (step 154). Also, the gate conductor spacers are formed of silicon-rich silicon oxynitride so a nitride film is deposited thereon as well. Essentially, the masking feature of the masked, laser irradiation system can be used selectively to deposit a nitride film on only a part of gate conductor 1240 and gate conductor spacers 1655. Thus, by masking local interconnect contact area 1675 and gate conductor spacer 1650 from the laser irradiation, a partially capping dielectric film 1665 may be deposited simultaneously with dielectric film 1660.

Figure 12:
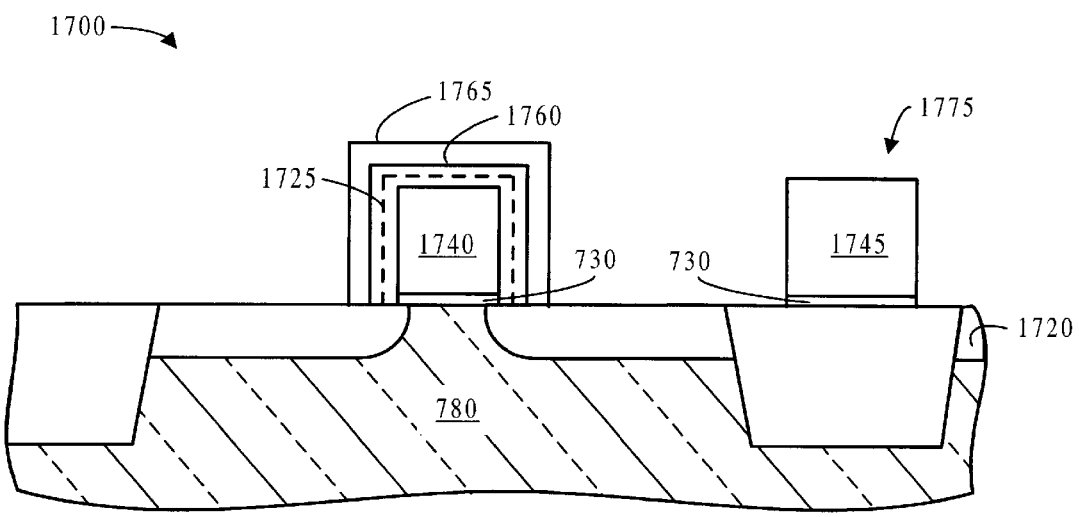

Although not a preferred embodiment, FIG. 12 shows yet another of the many possible embodiments within the scope of the present invention. Notably, wafer portion 1700 does not include spacers formed in the usual manner. Accordingly, the method used to produce wafer portion 1700 involved doping gate conductor 1740 and 1745, trimming gate conductor 1740, leaving dielectric film 1760 in place after trimming, doping diffusion areas 1720, and capping dielectric film 1760 with additional dielectric films 1765. Deposition of additional dielectric film 1765 may be needed when a thicker dielectric layer than was grown during trimming is desired to sufficiently cap gate conductor 1740. Noticeably, despite the two layers of dielectric film, each formed by a different mechanism, interconnect contact area 1775 remains open for formation of interconnect contacts without requiring an etch through a dielectric film.

Next, step 160 of method 100 includes deposition of a conformal dielectric layer, such as a passivation oxide, to cover the fabricated structures discussed above, filling gaps and voids. Any dielectric layer known to be suitable by those skilled in the art may be used. In step 170, contact holes are etched into the passivation oxide for diffusion contacts and, possibly, for local interconnect contacts or gate contacts. If interconnect contact areas were left open during capping, as shown in FIGS. 8–12, then diffusion contacts and local interconnect contacts may be defined with a single mask. If interconnect contact areas are covered with a dielectric film from capping (not shown) then an optional etch step 180 is required to open the interconnect contact areas. Thus, an additional mask for etching open the local interconnect contacts alone will be required so that the additional etch will not remove the exposed portions of the dielectric layer that allows contacts to diffusion areas to be borderless.

Figure 13:
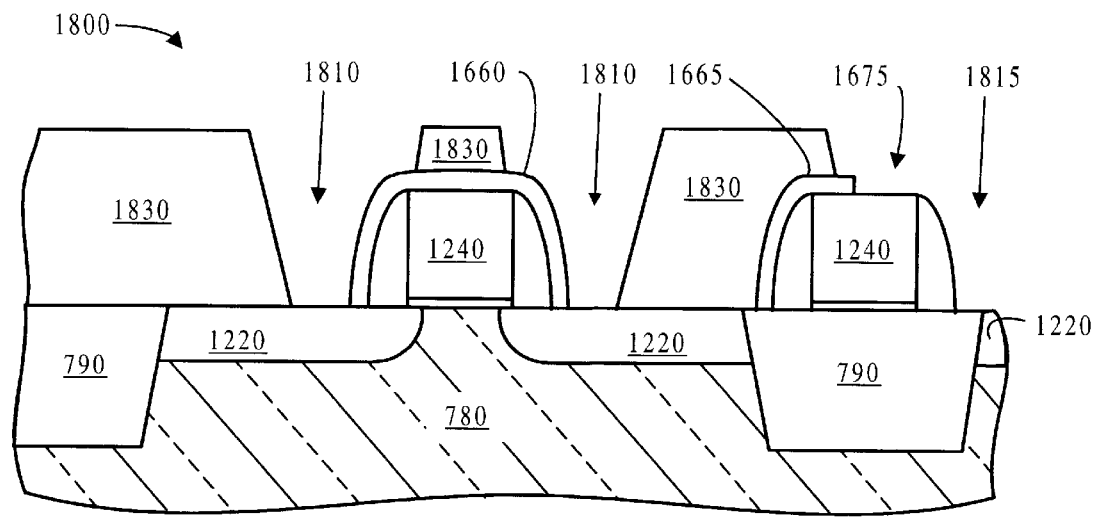
Figure 15:
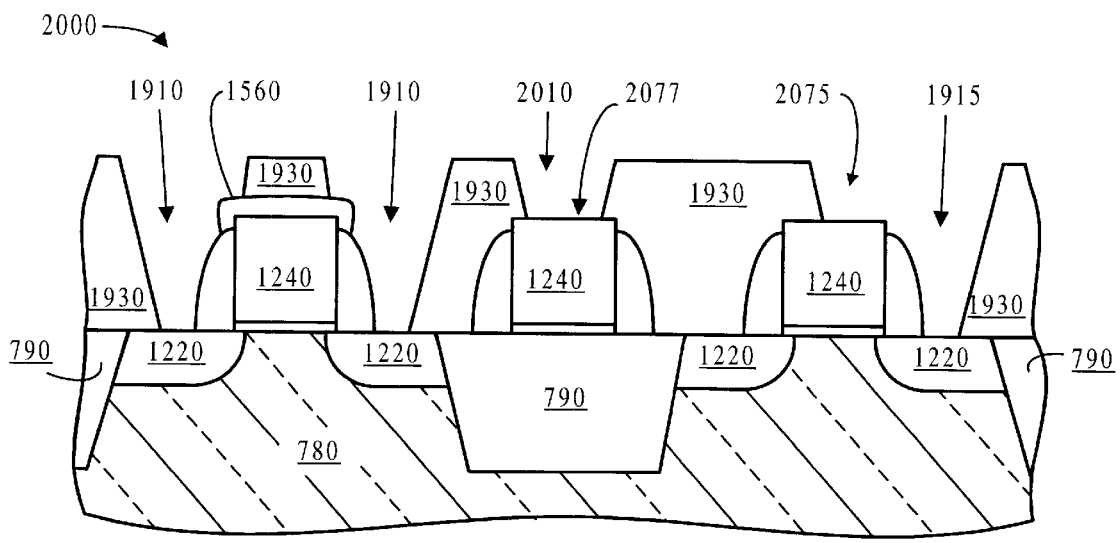
Figure 16:
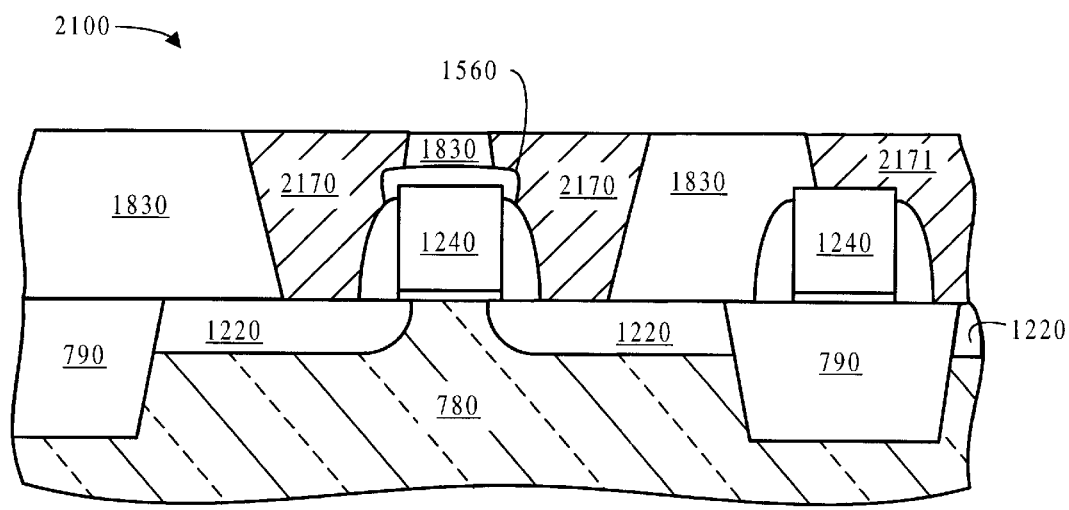
FIG. 16 is a cross-section view of a wafer portion showing borderless contacts formed according to a preferred embodiment of the present invention.

Wafer portion 1800 in FIG. 13 shows a passivation oxide layer 1830 that was deposited on wafer portion 1600 from FIG. 11 and then etched as in step 170 to form diffusion contact holes 1810 and local interconnect contact hole 1815. Noticeably, local interconnect contact area 1675 is open, so holes for contacts to diffusion areas 1220 and local interconnect contact area 1675 may be defined with a single mask and a single etch step. Also, gate conductor 1240 is capped by dielectric film 1660 to allow for borderless diffusion contacts. Wafer portion 1900 in FIG. 14 shows a passivation oxide layer 1930 that was deposited on wafer portion 1500 from FIG. 10 and then etched as in step 170 to form diffusion contact holes 1910 and local interconnect contact hole 1915. Local interconnect contact area 1575 is open, even though gate conductor 1240 is otherwise capped by dielectric film 1560 to allow for borderless diffusion contacts. Wafer portion 2000 in FIG. 15 shows another preferred embodiment of the present invention wherein a gate contact area 2077 was masked during irradiation. Accordingly, gate contact hole 2010 may be defined along with diffusion contact hole 1910 and local interconnect contact hole 1915 with a single mask and a single etch step. Once method 100 is completed as described above, then metallization may be deposited to form diffusion contacts 2170 and local interconnect metallization 2171 as exemplified by wafer portion 2100 in FIG. 16.

Given the numerous options that are possible within method 100 of FIG. 1, there are numerous possibilities for structures that may be produced. FIGS. 3–16 present only a few of the possible wafer portions that may result from method 100 and other wafer portions are conceivable that are within the scope of the present invention according to the preferred embodiment for method 100 shown in FIGS. 1 and 2 as discussed above. The examples below set forth specific process conditions for performing various steps of method 100 and, thus, each is presented as a more preferred embodiment of method 100.

EXAMPLE 1

Substrate Preparation. A complimentary metal-oxide semiconductor (CMOS) logic silicon substrate is prepared which has isolation trench structures, gate oxide, polysilicon gate conductor with oxide/nitride spacers, and diffusion areas defined. In a typical application, the isolation trench is etched 0.2–0.3 micrometers ($\mu$m) into the silicon wafer. The gate oxide is 3–5 nanometers (nm) thick. The polysilicon gate is 0.10–0.25 $\mu$m wide and 0.1–0.2 $\mu$m thick. The spacers are 10–20 nm thick for the oxide layer and 20–30 nm thick for the nitride layer. In a CMOS structure such as this, the gate conductor and diffusions have been doped after etching the gate, to provide sufficient conductivity. After the doping is performed, the gate conductor can be selectively nitrided, covering all areas of the gate conductor except where the gate contact and local interconnect must make contact. A selective nitridation is accomplished by using a masked laser irradiation (308 nm) of the substrate. This masked irradiation process utilizes the masked, high-power laser irradiation system commercialized by Verdant Technologies, a subsidiary of Ultratech. This masked laser expose system is capable of providing up to 500 milliJoules (mJ)/square centimeter ($cm^2$) of energy fluence at the wafer surface for each laser pulse. This level of energy is sufficient to melt the surface of polysilicon materials on the substrate. The examples below indicate the preferred process conditions under which selective nitridation may be accomplished.

EXAMPLE 2

Selective Nitride Deposition From Silane and Ammonia. A silicon wafer substrate is prepared as above, with isolation, diffusion and gate structures. In this embodiment, it is not necessary to melt the surface of the polysilicon in order to deposit the nitride. As such, the energy fluence per pulse at the wafer surface can range from about 100–500 mJ/$cm^2$, with preferred expose values of about 300 mJ/$cm^2$. The number of expose pulses can range from 10 to 1000, depending on the desired thickness of deposited nitride; preferred values are from 50–300 pulses. The substrate temperature can range between 500 and 1200° C., with values of about 850° C. being preferable as indicated in U.S. Pat. No. 4,592,933 to Meyerson et al, that is incorporated herein by reference.

During the expose, the ammonia and silane gases are placed in the immediate environment of the wafer. This is accomplished by utilizing the evacuation and chemical injection system of the Verdant Technologies laser expose tool. Prior to introduction of the reactive gases, the wafer is placed in the expose chamber, the chamber is evacuated, and a flow of ammonia and silane is established in the process chamber. Suitable flow values of 100 cubic centimeters (ccm)/minute (min) of ammonia and 10 ccm/min of silane are appropriate, providing a 10:1 ratio of ammonia to silane as indicated in U.S. Pat. No. 4,672,169 to Chambers, that is incorporated herein by reference. The pressures of reagents should range from 0.1–760 torr, with values of 1–10 torr being preferable.

If it is desired to deposit thick films of nitride, some disilane may be blended into the flow of reactive gases (about 10 ccm/min, at about equal pressure to the silane). Nitride films deposited by this method tend to be silicon-rich and will consequently also absorb the 308-nm laser irradiation, allowing continuous film growth to occur. To some extent, the silicon composition can be varied by varying the relative composition of the reactant gases, as desired. For applications to the formation of borderless contacts, the deposited film thickness can be 10–200 nm, with preferable values of 50–100 nm.

The polysilicon of the gate conductor is selectively heated by this expose process. As such, the nitride deposition is limited to the exposed polysilicon surface of the gate conductor. By means of the masking capability of the Verdant expose tool, segments of the gate conductor can be selectively coated with nitride, while other portions of the gate conductor can remain free of this dielectric. The mask is designed such that contact areas for the gate contact and local interconnect remain un-coated with nitride, while portions of the gate conductor adjacent to source/drain contacts are coated with nitride. As a result, the etching of these contacts through a passivation oxide dielectric can be borderless with respect to the nitrided gate conductor.

EXAMPLE 3

Selective Surface Nitridation of the Polysilicon Gate with Ammonia. A silicon wafer substrate is prepared as above, with isolation, diffusion and gate structures. In place of depositing a silicon nitride layer on the gate conductor by exposing the irradiated wafer to silane and ammonia, the irradiated wafer is exposed only to ammonia vapor. When a melted silicon film (melted by laser irradiation at 308 nm) is exposed to ammonia, a silicon nitride film can be formed in the surface of the silicon. Films as thick as 500 nm may be grown by this method. In a polysilicon gate according to the present invention, 50–100 nm of nitride are desirable so the sample is irradiated with an energy fluence of 200–700 $mJ/cm^2$ per pulse, or more preferably 400–500 $mJ/cm^2$, in the presence of 10–1500 torr of ammonia, or more preferably about 1200 torr ammonia, at 100 ccm/min for a duration of 100–2000 pulses, or more preferably about 300 pulses. The polysilicon is selectively heated by the 308-nm irradiation, and a nitride layer is selectively grown on the polysilicon gate. As described in EXAMPLE 2, this selectively nitrided gate can be used as a means of fabricating borderless contacts in conjunction with a local area contact to diffusion and the gate conductor, with a single mask process.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation. For example, it will also be understood by those skilled in the art that the invention is applicable to different isolation technologies (e.g., LOCOS, recessed oxide (ROX), etc.), well and substrate technologies, dopant types, energies and species. It will also be understood that the spirit of the invention is applicable to other semiconductor technologies (e.g., BiCMOS, bipolar, silicon on insulator (SOI), silicon germanium (SiGe), etc.).

What is claimed is:

1. A transistor comprising:

a gate dielectric on a substrate;

a gate conductor on the gate dielectric;

etched back sidewall spacers on sides of the gate conductor and the gate dielectric, the etched back sidewall spacers exposing corners of the gate conductor, wherein a top of each spacer is below a top of the gate conductor; and a gate conductor cap covering the corners, top edges, and the top of the gate conductor and covering at least a portion of the tops of the etched back sidewall spacers.

2. The transistor of claim 1 further comprising diffusion areas in the substrate adjacent to and underneath the sidewall spacers.

3. The transistor of claim 2, wherein surfaces of the diffusion areas comprise selective metal silicide.

4. The transistor of claim 1 wherein the gate conductor cap comprises silicon nitride.

5. A transistor comprising:

a gate dielectric on a substrate;

a gate conductor on the gate dielectric the gate conductor having sides;

a gate conductor cap on the gate conductor; and sidewall spacers on sides of the gate conductor, on sides of the gate dielectric, and on lower portions of sides of the gate conductor cap;

wherein the gate conductor cap further comprises:

a lower portion abutting sides of upper portions of the sidewall spacers and having a bottom that is lower than upper portions of the sidewall spacers; and an upper portion that is higher than the upper portion of the sidewall spacers, wherein the upper portion does not abut the sidewall spacers.

6. The transistor of claim 5 further comprising diffusion areas in the substrate adjacent to and underneath the sidewall spacers.

7. The transistor of claim 6, wherein surfaces of the diffusion areas comprise selective metal silicide.

8. The transistor of claim 5, wherein the gate conductor cap comprises silicon nitride.

* * * * *